ELECTROPHORETIC PHOTORESIST COMPOSITION AND A METHOD OF FORMING ETCH RESISTANT MASKS

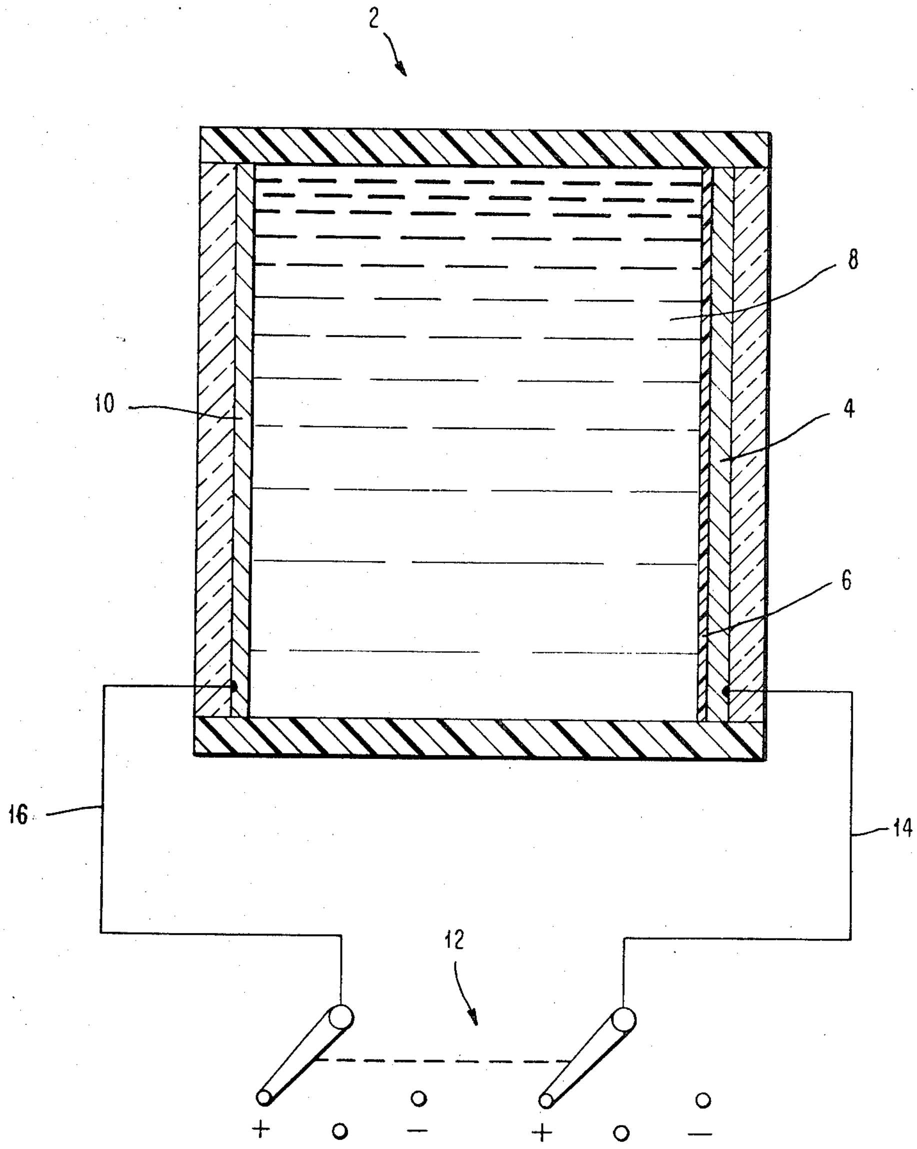
INVENTOR
PETER BAKOS
BY Hansel L. McGee
ATTORNEY 3,738,835

Peter Bakos, Wappingers Falls, N.Y., assignor to International Business Machines Corporation, Armonk, N.Y.

Continuation-in-part of abandoned application Ser. No. 887,704, Dec. 23, 1969. This application Oct. 21, 1971, Ser. No. 191,559
Int. Cl. G03c *1/68, 5/00*
U.S. Cl. 96—36 10 Claims

ABSTRACT OF THE DISCLOSURE

A photoresist composition which can be uniformly deposited on a metal substrate by electrophoresis is provided. The electrophoretic photoresist composition is an emulsion prepared from a first solution containing a polychloroprene material, a sensitizer, a stabilizer and a polymeric resin binder and a second solution containing a wetting agent, surfactants, N-methyl-2-pyrrolidone and triethanol amine. The emulsion is formed by the dropwise addition of the second solution into the first solution while agitating the same. A method for preparing fine line structures using the above composition is also provided.

The high resolution photoresist composition of this invention is used in the manufacture of semiconductor devices such as, diodes, transistors, and microelectronic blocks where very fine lines of 1 micron thickness or less are required. The composition can also be used to electrophoretically coat irregularly shaped articles requiring uniformity of coating.

This application is a continuation-in-part of copending patent application Ser. No. 887,704, filed on Dec. 23, 1969, and now abandoned.

BACKGROUND OF THE INVENTION

Field of the invention

This invention relates to a photoresist composition which can be electrophoretically deposited and to a method of etching in which the photoresist composition of this invention is utilized.

Description of the prior art

The use of photoresist materials is important in the manufacture of semiconductor devices such as diodes, transistors and microelectronic blocks. One of the major problems of the currently used photoresist materials and methods of applying them is the inability to produce very fine lines with an acid resistant film capable of meeting all the processing requirements for producing an etched semiconductor.

Commercially available photoresist materials do not have resolution capability for producing line widths of 1 micron or less while maintaining smooth edges, which is important in order to result in minimum electrical noise. Additionally, the photoresist materials presently used result in pin holes and are not always capable of withstanding low surface tension or highly corrosive etches without undercutting or lifting at the edges of the film.

While some of the above disadvantages are attributable to the particular photoresist material, a great deal of the problem exists in the manner in which the material is deposited. For example, the problem of pin holes, as well as the undercutting of the film, can arise from non-uniform depositing of the film. Normally the photoresist coating is deposited by dip-coating, spin-coating, doctor blading and the like. Any one of the above methods can lead to the source of the problems mentioned.

To overcome some of these problems the prior art has resorted to any number of different photoresist materials and to methods of treating the same, prior to coating. For example in U.S. Pat. No. 3,423,262 there is described a method of treating commercially available photoresist materials. The material is subjected to electrophoresis in order to remove foreign particles and dispersed sludge from the material. After the electrophoretic treatment the material is coated by conventional methods.

Electrophoresis has been used to coat ornamental objects with organic coatings. This coating method has the virtue of depositing composition coatings having uniform thickness. U.S. Pat. No. 2,307,018 discloses one method of forming an insulating coating on an anode by submerging it in a bath of finely divided insulating organic particles in a liquid medium. When a potential is applied between the anode and a cathode, which is also submerged in the bath, a coating is deposited in the anode.

Electrophoretic coating of natural and synthetic resins is further discussed in the May 1944 issue of Metal Finishing Magazine, volume 42, page 313 by Edward J. Roehl in an article entitled, "A Discussion on Electrophoretic Finishing." U.S. Pat. No. 3,200,057 teaches an improved electrophoretic coating process for coating conductive surfaces. U.S. Pat. No. 3,303,078 discloses a method of making electrical components in which resistive elements are electrophoretically deposited on a conductive surface. None of the above-cited prior art discloses a photoresist composition which can be electrophoretically coated or to a method of preparing microelectronics in which fine lines are obtainable using an electrophoretically deposited photoresist material. The above-cited art does not address itself to the problems above mentioned.

SUMMARY OF THE INVENTION

The present invention is directed to a method of etching fine lines of the order of 1 micron or less in a metal substrate wherein a photosensitive composition is uniformly deposited on the substrate by an electrophoresis technique. The photosensitive composition is so deposited from a stable emulsion prepared from a first solution comprising a polychloroprene polymer, a sensitizer selected from 4,4'-bis-(dimethyl-amino)-benzophenone, 4,4'-bis-(dimethyl-amino)-thiobenzophenone, 9-xanthenone, benzil and coumaron, a stabilizer such as hydroquinone, 4,4'-dimethoxy-diphenylamine, 2,5-diphenylbenzoquinone, phenyl-α-naphthylamine and N,N'-diphenyl-P-phenylenediamine and a hardener such as a partially cured epoxy resin or other polymeric compositions in an 80% butyl acetate and 20% methylethyl ketone solution and a second aqueous solution comprising a wetting agent, e.g., anionic slurfactants, such as 3M FC 161, a series of fluoro carbons prepared by Minnesota Mining & Manufacturing Co., and N-methyl-2-pyrrolidone and triethanol amine.

FIG. 1 depicts a typical electrophoresis cell containing a bath and electrodes.

DESCRIPTION OF PREFERRED EMBODIMENTS

In the practice of the present invention there is provided a two part solution, the mixture of which produces a stable emulsion. In solution A there is used a polychloroprene material commercially known as "Neoprene W" which is prepared from 2-chloro-1,3-butadiene by E. I. du Pont de Nemours and Company. This polychloroprene material has a uniform molecular weight distribution and is sulfur free. It has a number average molecular weight of about 500,000. Polychloroprene has been used as a photoresist material and is disclosed as such in now abandoned patent application Ser. No. 586,-371, entitled "Photoresist Compositions," to Peter Bakos et al. and U.S. Pat. No. 3,551,160 entitled, "Method of Preparing Photosensitive Poly (2-chloro-1,3-Butadiene)" to Peter Bakos et al., both of which are assigned to the same assignee of the present application.

It is essential that the polychloroprene material be present in solution A in the amount of 10.0 to 120.0 g. per liter of solution. It has been shown that working outside of the prescribed range the resulting coating fails as a good resist material. For example, if polychloroprene is added in an amount which exceeds the above range its sensitivity is gravely impaired, so that the times of exposure to light are beyond workable limits. If amounts less than the prescribed range are used, the resulting resist coating is found not to resist strong bases and acids.

A sensitizer for rendering polychloroprene sensitive to actinic radiation is selected from 4,4′-bis-(dimethyl-amino)-benzophenone, 4,4′ - bis - (dimethyl - amino)-thiobenzophenone, 9-xanthenone, benzil and coumaron. These are well known photosensitizers and are present in the amount of from about 0.5 g. to about 4.0 g. per liter of solution.

A stabilizer is also added to solution A in the amount of from about 0.01 g. to 0.02 g. per liter of solution. The stabilizer serves to prevent unsaturated polymeric materials from decomposing in solution. Additionally, an epoxy resin system comprising 70–90 parts polyglycidyl ether of bis-phenol A and 10–30 parts tetrakis (hydroxyphenyl) ethane tetraglycidyl ether partially cured with 3 to 4 parts of dicyandiamide and 0.2 to 0.4 part of a tertiary amine, all parts being parts by weight per 100 parts of resin solids, or a saturated or unsaturated polymer resin such as polyvinylcinnamate, polystyrene, polymethacrylate and polyacrylate is added to solution A. The resin system is added in the amount of about 2.0 g. to about 6.0 grams. Again it is essential that the resin system be added in the amount falling within the above range. If the resin system is added in amounts above the range given, cross-linking of the photopolymer is inhibited. If used in an amount less than the given range, undercutting of the resist occurs during etching. The resin serves to eliminate tackiness in the photopolymer.

All of the above constituents of solution A are dissolved in 1 liter of solvent comprising 80% butyl acetate and 20% methylethyl ketone or 80% cyclohexanone and 20% methylethyl ketone.

Solution B is an aqueous solution primarily composed of a water soluble wetting agent such as 3M FC 161, FC 98 and FC 95, i.e., fluorochemical surfactants, in the amount of about 0.25 g. to about 5.0 g. per liter; N-methyl - 2 - pyrrolidone in the amount of about 50 ml. to about 200 ml. per liter and triethanol amine or diallylisophathalate as a plasticizer from about 0.2 g. to 8.0 g. per liter.

An emulsion is prepared from solutions A and B as follows:

About 150–450 ml. of solution B is added dropwise to about 850 ml. to about 550 ml. of solution A. Solution A is continuously and vigorously agitated during the addition of solution B. After completion of the addition of solution B, the resulting emulsion is agitated for another four hours and is ball milled for about 24 hours in order to comminute large particles that may appear in the emulsion.

In operation, the emulsion as prepared above, is poured into a bath container shown generally as 2 in the figure. Bath container 2 has disposed therein a metal electrode member 4 upon which a polymer coating 6 is to be electrophoretically deposited from the bath 8 of the type described. A second metal electrode member 10 is also disposed in container 2. A power supply 12 is connected to electrode members 4 and 10 through leads 14 and 16, respectively. During the energization of the circuit formed by electrode members 4 and 10, and leads 14 and 16, a photosensitive coating 6 is deposited. The coated electrode 4 is removed from the bath, air dried, subjected to actinic radiation, developed and the exposed metal electrode is etched in a predetermined pattern.

In a preferred embodiment of the invention, a first solution A is prepared by dissolving 4 g. of "Neoprene W," 0.06 g. of 4,4′-bis-(dimethyl-amino)-benzophenone, 0.002 g. of hydroquinone and 0.3 g. of the partially cured epoxy resin system prepared from 70–90 parts of polyglycidyl ether of bisphenol A, 10–30 parts tetrakis (hydroxyphenyl) ethane tetraglycidyl ether, 3–4 parts dicyandiamide and 0.2 to 0.4 part of tertiary amine in a solvent consisting of 80 ml. of butyl acetate and 20 ml. of methylethyl ketone.

A second solution B is prepared by dissolving 0.05 g. of a wetting agent 3M FC 161 into 25 ml. of water and then adding 2.5 ml. of N-methyl - 2 - pyrrolidone and 0.1 g. of triethanolamine to the solution.

Solution B is then added dropwise to solution A with agitation. The mixture is continuously agitated for another 4 hour period. The resulting emulsion is then ball milled for about 24 hours. After the ball milling operation is completed, the emulsion is placed in bath container 2 of the figure. In this instance electrode 4 serves as the anode and is composed of copper, with electrode 10 serving as the cathode and is composed of platinum. A potential of about 27 to about 33 volts having a current of about 200 to about 260 milliamps is applied across electrodes 4 and 10 for about 45 to about 60 seconds. A uniform coating 6 of neoprene and epoxy resin is thus deposited on electrode 4. The coating is about 85 microns to about 120 microns thick. Electrode 4 and its coating 6 is removed from the bath 8, air dried and baked at 100° C. for about 5 minutes to harden the deposited coating. The so treated coating 6 is then exposed to ultraviolet light through a negative pattern and is solvent developed with high boiling ketones such as, cyclohexanone. The exposed areas of the coating 6 remain on the copper surface and provide a high resolved image. Lines of about 1 micron or less are etched into the copper surface, according to the pattern formed by the coating 6, with a $FeCl_3$ etchant.

In another embodiment the above process is performed except that solution A was prepared by dissolving 4.0 g. of "Neoprene W," 0.06 g. of 4,4′-bis-(dimethyl-amino)-benzophenone, 0.02 g. of hydroquinone and 0.3 of polyvinyl cinnamate in 80 ml. of cyclohexanone and 20 ml. of methylethyl ketone. Coatings of equal quality as above are obtained.

There has been provided a novel method of preparing microelectronic devices in which lines of 1 micron or less are required. Generally the process entails the electrophoretic deposition of a photosensitive coating on a metal substrate. The deposited coating is comprised of "Neoprene W" and a polymeric material selected from epoxy resins, polyvinyl cinnamate, polystyrene, polymethacrylate and polyacrylate. The coating is electrophoretically deposited from a novel emulsion prepared from a first and second solution, wherein said first solution consists of "Neoprene W," a photosensitizer, a stabilizer and a hardener, and said second solution consisting of a wetting agent N-methyl-2-pyrrolidone and triethanolamine.

What is claimed is:

1. A method of forming an etch resistant mask on a substrate comprising the steps of:

(a) preparing an emulsion from about 850 ml. to about 550 ml. of a first solution consisting of from about 10.0 g. to about 120.0 g. per liter polychloroprene, about 0.5 g. to about 4.0 g. per liter of a photosensitizer, about 0.01 g. to about 0.02 g. per liter of a stabilizer and about 2.0 g. to about 6.0 g. per liter of a polymeric resin binder dissolved in a solvent selected from a mixture of 80% butyl acetate and 20% methylethyl ketone, and 80% cyclohexanone and 20% methylethyl ketone, and from about 150 ml. to about 450 ml. of a second aqueous solution consisting of about 0.25 g. to about 5.0 g. per liter of a wetting agent, about 50 ml. to about 160 ml. per liter N-methyl-2-pyrrolidone and about 0.2 gram to about 0.8 gram per liter of triethanol amine;

(b) placing said emulsion in a bath container;

(c) providing a pair of electrodes in said bath container, one of which being said substrate;

(d) applying a potential across said pair of electrodes to deposit a photosensitive coating on said substrate;

(e) removing said coated substrate from said bath container and air drying the same;

(f) exposing and developing said coating on said substrate to form a pattern of high resolution and good adherence;

(g) chemically etching said substrate through said pattern to achieve etched lines of 1 micron or less without substantial undercutting of said coating.

2. A method according to claim 1 wherein just prior to exposing said coating, said coating is baked at a temperature not greater than 100° C. for a time not greater than about 5 minutes to harden said coating.

3. A method according to claim 1 wherein said photosensitizer is selected from the group consisting of 4,4′-bis-(dimethyl-amino)-benzophenone, 4,4′ - bis - (dimethyl-amino) - thiobenzophenone, 9 - xanthenone, benzil and coumaron, said stabilizer is hydroquinone, said polymeric resin binder is an epoxy resin consisting of from 70–90 parts of polyglycidyl ether of bisphenol A, 10–30 parts of tetrakis (hydroxyphenyl) ethane tetraglycidyl ether partially cured with 3–4 parts of dicyandiamide and, 0.2–0.4 part of tertiary amine.

4. A method according to claim 1 wherein said polymeric resin binder is selected from the group consisting of polyvinyl cinnamate, polystyrene, polymethacrylate and polyacrylate.

5. A method according to claim 1 wherein there is added the step of adding from 150 ml. to 450 ml. of said second solution dropwise to from about 850 ml. to about 550 ml. of said first solution while continuously and vigorously agitating said first solution.

6. A method according to claim 1 wherein said applied potential is from about 27 to about 33 volts having a current of about 200 to about 260 milliamps.

7. A method according to claim 1 wherein said potential is applied for about 45 to about 60 seconds.

8. An emulsion composition from which photosensitive coatings can be electrophoretically deposited comprising a mixture of:

(a) from about 850 ml. to about 550 ml. of a first solution consisting from about 10.0 g. to about 120.0 g. per liter of polychloroprene, from about 0.5 g. to about 4.0 g. per liter of a photosensitizer, from about 0.01 g. to about 0.02 g. per liter of a stabilizer and from about 2 g. to about 6 g. per liter of a polymeric resin binder, in an organic solvent; and (b) from about 150 ml. to about 450 ml. of a second aqueous solution consisting of a wetting agent, about 50 ml. to about 160 ml. per liter N-methyl-2-pyrrolidone and about 0.2 g. to about 8 g. per liter of triethanol amine.

9. An emulsion composition according to claim 8 wherein said photosensitizer is selected from the group consisting of 4,4′-bis-(dimethyl-amino) - benzophenone, 4,4′ - bis-(dimethyl-amino)-thiobenzophenone, 9-xanthenone, benzil and coumaron, said stabilizer is hydroquinone, said polymeric resin binder is an epoxy resin system consisting of from 70–90 parts polyglycidyl ether of bisphenol A, 10–30 parts tetrakis (hydroxyphenyl) ethane tetraglycidyl ether partially cured with 3–4 parts of dicyandiamide and 0.2–0.4 part of a tertiary amine.

10. An emulsion composition according to claim 8 wherein said polymeric resin binder is selected from the group consisting of polyvinyl cinnamate, polystyrene, polymethacrylate and polyacrylate.

References Cited

UNITED STATES PATENTS

| | | | |
|---|---|---|---|
| 2,109,968 | 3/1968 | Collins ---------- | 204—182 X |
| 3,408,191 | 10/1968 | Jeffers ------------ | 96—35.1 X |

DAVID KLEIN, Primary Examiner

U.S. Cl. X.R.

96—115 R, 35.1; 204—181